United States Patent [19]

Cole et al.

[11] 4,336,508

[45] Jun. 22, 1982

[54] VOLTAGE CONTROLLED INTEGRATED CIRCUIT ASTABLE MULTIVIBRATOR

[75] Inventors: Terence G. Cole; Stuart E. Marshall, both of Hampshire, England

[73] Assignee: International Business Machines Corporation, Armonk, N.Y.

[21] Appl. No.: 133,073

[22] Filed: Mar. 24, 1980

[30] Foreign Application Priority Data

Jun. 18, 1979 [GB] United Kingdom .............. 7921193

[51] Int. Cl.$^3$ ............................................. H03K 3/282
[52] U.S. Cl. .................................. 331/113 R; 331/8;
331/34; 331/177 R
[58] Field of Search ........... 331/108 C, 108 D, 113 R, 331/144, 145, 177R, 8, 34, 36

[56] References Cited

U.S. PATENT DOCUMENTS 3,869,679  3/1975  Grebene ..................... 331/113 R X
3,904,989  9/1975  Cordell ......................... 331/113 R

OTHER PUBLICATIONS

Cordell et al., "A Highly Stable VCO for Application in Monolithic Phae-Locked Loops", IEEE Journal of Solid State Circuits, vol. SC-10, Dec. 1975, pp. 480-485.
Grebene, "The Monolithic Phase-Locked Loop-A Versatile Building Block", IEEE Spectrum, Mar. 1971, pp. 38-49.

Primary Examiner—Siegfried H. Grimm
Attorney, Agent, or Firm—Theodore E. Galanthay

[57] ABSTRACT

Disclosed is an integrated circuit voltage controlled astable multivibrator with external fixed components: resistor RT and capacitor CT. The multivibrator has a center frequency which is a function of: the value of capacitor CT, the amplitude of a constant current I1 used to charge and discharge capacitor CT, and a voltage VT. The period timed is proportional to VT/I1 where VT is half the voltage swing across capacitor CT. Undesired frequency variations are minimized by generating both current I1 and voltage VT in similar matched networks and from the same voltage source so that I1 and VT track each other.

11 Claims, 6 Drawing Figures 4,336,508

VOLTAGE CONTROLLED INTEGRATED CIRCUIT ASTABLE MULTIVIBRATOR

DESCRIPTION

TECHNICAL FIELD

The present invention relates to a voltage controlled oscillator (VCO) for use in semiconductor integrated circuit chips as a component part of a phase-locked loop (PLL).

BACKGROUND ART

Phase-locked loops (PLL) have numerous applications in communications and data processing. An article by A. B. Grebene "The Monolithic Phase-locked Loop—a Versatile Building Block", pages 38 to 49, IEEE Spectrum, March 1971 describes the basic principles and design parameters of an integrated PLL together with a wide range of applications.

In the above article, FIG. 12B shows an emitter coupled multivibrator as a basic VCO circuit for integrated PLL design. FIG. 14 shows a circuit schematic of an integrated PLL including an emitter coupled multivibrator VCO having an external timing capacitor with a separate temperature compensating bias network to minimize temperature drift to oscillator frequency. However, the frequency compensation provided is apparently insufficient, taking into account manufacturing tolerances and voltage supply variations, to give a sufficiently close tolerance center frequency to lie within the capture range of the PLL without adjustment of the external timing capacitor. It should be noted that this design does not address the problems of frequency variation due to manufacturing tolerances and voltage supply tolerance.

Additional known prior art is UK Pat. No. 1,500,085 entitled "Improvements in or relating to Multivibrators". The same subject matter is published in an article by R. R. Cordell and W. A. Garrett entitled "A Highly Stable VCO for application in Monolithic Phase-locked Loops", pages 480 to 485, IEEE Journal of Solid-State Circuits, Volume SC-10, No 6, December 1975.

This Cordell et al article describes an emitter coupled integrated circuit multivibrator used with an external timing capacitor C between the emitters of two transistors and an external resistor R. Two emitter current sources are controlled by a reference voltage. The collector currents of the two transistors are controlled so that the circuit switches state when the voltage across the capacitor C equals the forward voltage of a PN junction carrying a current bearing a fixed ratio to the emitter currents. The same voltage is used as the reference voltage. It is shown theoretically that the frequency is proportional to $\frac{1}{4}RC$ and is thus independent of temperature and voltage supply variation.

However, it will be noted that the practical circuit shown in FIG. 3 of both the patent specification (UK Pat. No. 1,500,085) and the Cordell et al article is very complex and includes circuit refinements to enhance the temperature performance.

Several silicon chips are available commercially which include a voltage controlled oscillator (VCO) incorporated in a phase locked loop (PLL). However, these available PLL chips require that the center frequency of the VCO must be adjusted by trimming either an external resistor or an external capacitor, so that the center frequency lies within the capture range of the PLL. This adjustment requires the services of a skilled technician and is undesirable when the PLL is for use in equipment manufactured in large volumes e.g. alphanumeric displays or television receivers.

SUMMARY OF THE INVENTION

The present invention addresses the problem of VCO center frequency adjustment by enabling a VCO to be designed and manufactured on a silicon chip with a sufficiently close tolerance on its center frequency so that it may be used with a fixed external resistor and capacitor. Thus the VCO as manufactured may be used in a PLL without requiring center frequency trimming.

According to the present invention, a voltage controlled oscillator comprises an astable multivibrator having a center frequency timed by the constant current charge and discharge of a capacitor, the period timed being proportional to VT/I where VT is half the voltage swing of the capacitor and I is a constant current, a control voltage input for varying the frequency, integrated circuit means for generating both a voltage VT and constant currents I for the capacitor from a common voltage source via similar matched transistor/resistor networks so that the voltage VT and constant currents I track each other in order to minimize variations in center frequency due to temperature and supply voltage variations.

BRIEF DESCRIPTION OF THE DRAWINGS

In order that the invention may be more readily understood, reference will now be made, by way of example, to the accompanying drawings in which.

DISCLOSURE OF THE INVENTION

Figure 1:
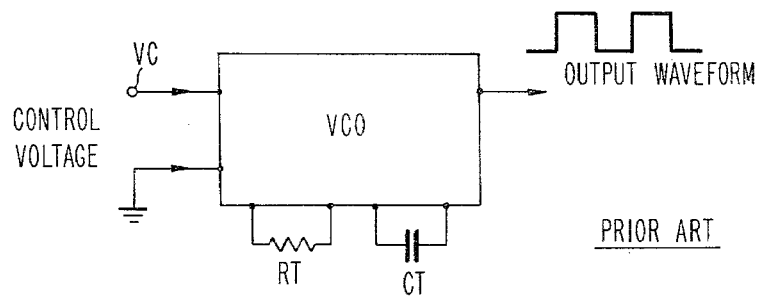
FIG. 1 illustrates a basic prior art voltage controlled oscillator (VCO).

A diagram of a basic prior art voltage controlled oscillator (VCO) is shown in FIG. 1. The VCO is manufactured as an integrated on a silicon chip with terminals for external timing components such as resistor RT and capacitor CT. These external timing components define a unit of time and should define the center frequency F0 when the control voltage VC is zero as:

$$F0 = K1/RTCT$$

where K1 is a constant determined by the design of the oscillator circuit. A differential control voltage VC applied to the control input terminals should increase or decrease the frequency F linearly with respect to the center frequency Fo. The rate of change of frequency with control voltage is called the gain of the VCO and is given by $\partial F/\partial VC = K2$. Ideally, both K1 and K2 should be constants, independent of manufacturing tolerances, temperature changes and supply voltage variations.

Figure 2:
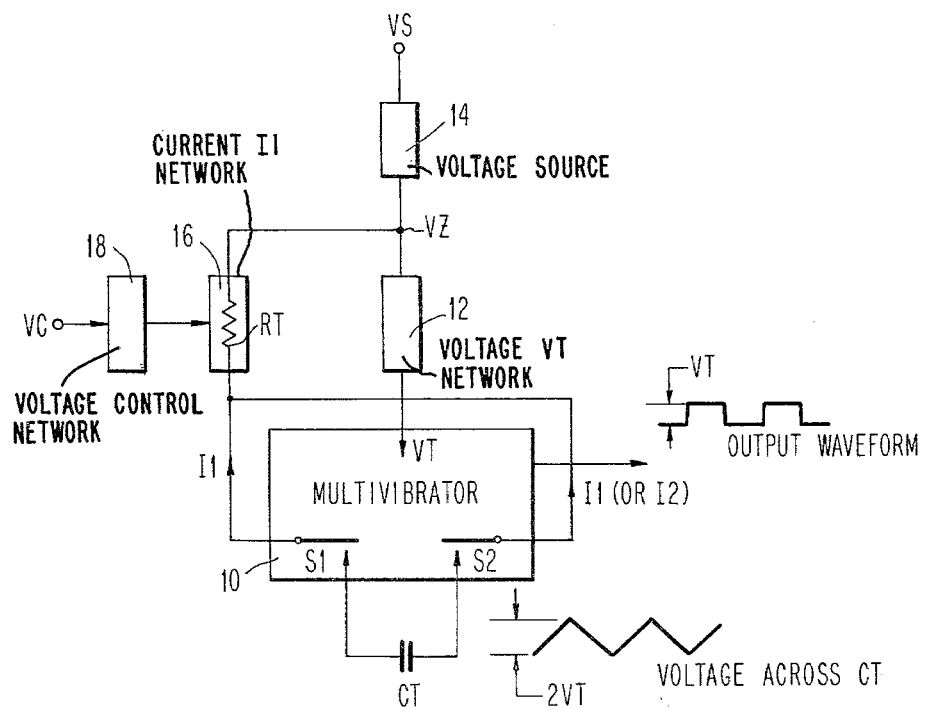
FIG. 2 is a block diagram of a VCO illustrating the concepts of the present invention.
Figure 3:
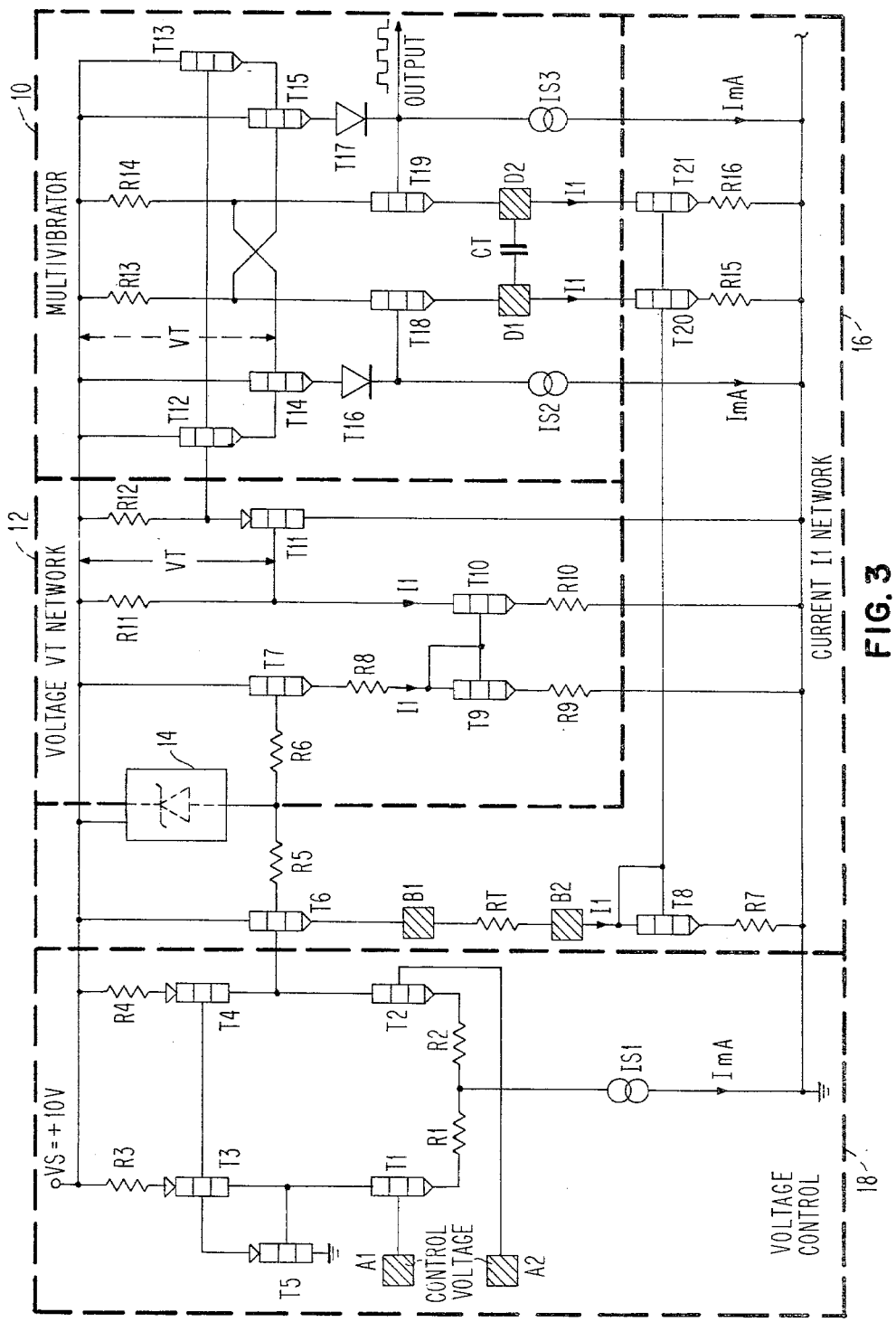
FIG. 3 is a circuit diagram of a practical VCO divided into functional blocks.

FIG. 2 illustrates schematically the circuit concepts of the invention which are embodied in the practical VCO circuit shown in FIG. 3. The schematic represents an integrated circuit manufactured on a silicon chip together with external timing components, capacitor CT and resistor RT, connected to an astable multivibrator 10. AT the center frequency when control voltage VC is zero, the multivibrator 10 charges and discharges the capacitor CT linearly by operating switches S1 and S2 so that constant current I1 is applied alternately to each terminal of the capacitor. The multivibrator circuit is designed so that the voltage swing across the capacitor is 2 VT, VT being a voltage generated by network 12. Thus the center frequency F0 is given by I1/4CTVT and each period timed by capacitor CT is proportional to VT/I1. It is well known in the semiconductor art that transistors and resistors deposited on a silicon chip have closely matched characteristics and these characteristics vary together or track each other with variations of voltage or temperature. This inherent property of integrated circuits is employed here by arranging that voltage VT and constant currents I1 track each other to minimize variation in the center frequency F0.

A circuit 14 connected to voltage supply VS provides a low impedance voltage source VZ which has less voltage variation than voltage VS. Similar matched transistor/resistor networks 12 and 16 are connected to voltage source VZ. Network 16 includes a precision timing resistor RT and generates two constant currents I1 giving a square wave output waveform (i.e. all timed periods are equal). Constant currents I1 and I2 (I1 and I2 being unequal) are generated when an asymmetric waveform is required. Network 12 has the same transistor/resistor circuit configuration as network 16 to produce substantially the same constant current I1 which is passed through a resistor to generate a voltage VT. This voltage is buffered into the multivibrator whose circuit is so arranged that during oscillation the capacitor CT has a voltage swing of 2 VT. Thus, since networks 12 and 16 are similar and use transistors and resistors with matched characteristics, the constant currents I1 or (I2) and voltage VT track each other as the temperature varies.

The control voltage VC is applied via voltage control network 18 to network 16 to vary the constant currents I1 or (I2) without disturbing the matched characteristics of networks 12 and 16. This is achieved by arranging that VC operates to vary the voltage applied to network 16 above or below the voltage VZ. Thus the effect of temperature on the gain of the VCO is minimized.

Figure 4:
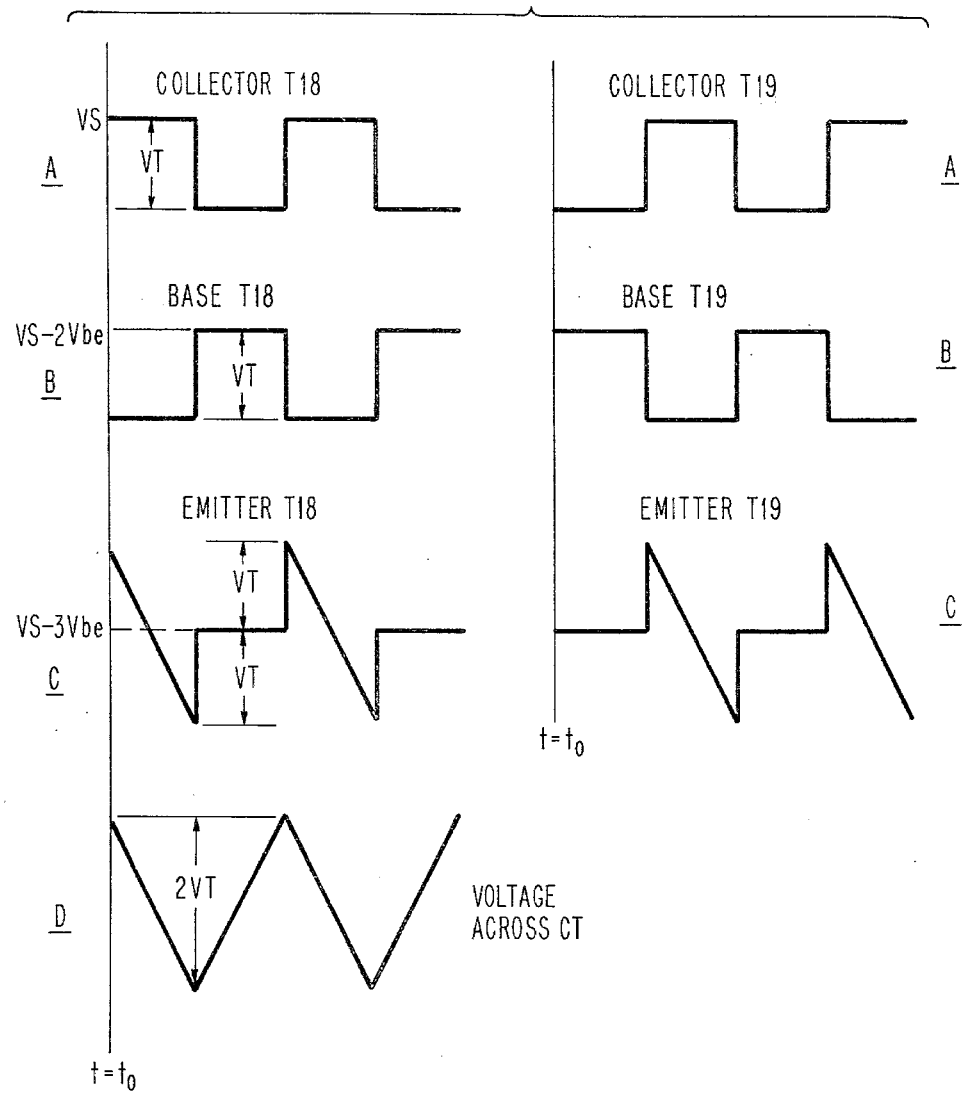
FIG. 4 shows the waveforms generated by the circuit of FIG. 3.

Refer now to FIGS. 3 and 4 which show a practical VCO circuit and associated voltage waveforms. The circuit of FIG. 3, apart from timing resistor RT and timing capacitor CT, are manufactured as an integrated circuit on a silicon chip with terminals A1 and A2 for a control voltage, B1 and B2 for resistor RT, and terminals D1 and D2 for capacitor CT. The square wave voltage output is taken to a conventional on chip buffer amplifier (not shown) to avoid loading the oscillator. Constant current sources IS1, IS2 and IS3, each providing approximately 1 mA are shown schematically to simplify the circuit diagram. These are conventional constant current sources similar to the transistor/resistor combination T20/R15 and T21/R16 used for producing constant current I1.

The circuit is roughly divided by dashed lines into four functional parts, a multivibrator 10, a Voltage VT Network 12 and a Current I1 Network 16 connected to the Multivibrator 10 and Voltage Control Network 18 to vary the oscillator frequency from its center frequency via the Current I1 Network 16. These parts will be described in turn.

The multivibrator 10 is an astable emitter-coupled multivibrator similar in operation to a conventional emitter-coupled multivibrator as described on page 480 of the aforementioned IEEE Journal of Solid State Circuits, but is tailored for this particular VCO application. As the circuit is designed to produce a square wave output, the circuit is symmetrical with constant currents I1 being supplied to both sides of capacitor CT. Resistors R13 and R14 have equal values and are selected so that 2I1 R13 (or R14) exceeds voltage VT, to give adequate voltage swing at the collectors of transistors T18 and T19. T16 and T17 are transistors connected as diodes and are represented by a diode symbol. The circuit of FIG. 3 is designed so that all transistors are non-saturating during operation.

The circuit in the initial conditions of transistor T18 OFF and transistor 19 ON is shown at the start of FIG. 4, waveforms A. As transistor T18 is OFF, its collector is at the supply voltage VS, and so the base of transistor T15 is also at voltage VS, holding transistor T13 OFF. Thus transistor T15 is ON and T17 is conducting the 1 mA current supplied by current source IS3, whereby the base and emitter of transistor T19 are at VS−2Vbe and VS−3Vbe, respectively (see FIG. 4, waveforms B and C). The collector of transistor T19 is 2I1, one half (I1) passing through the current source T21/R16 with the other half (I1) passing through the current source T20/R16 via capacitor CT.

As will be described later, the Voltage VT Network sets the emitter of transistor T11 at a voltage level of VS−VT+Vbe. As transistor T19 is ON, the current 2I through resistor R14 ensures that transistor T12 is conducting and the voltage at its base will be VS−Vt which holds the collector of transistor T19 at this level. Current source IS2 generates a 1 mA current which is taken by serially connected transistors T14 and diode connected transistor T16, holding the base of transistor T18 at a voltage level of VS−VT−2Vbe.

Assume that under these initial conditions the emitter of transistor T18 is at a voltage level of VS−3Vbe+VT as shown in FIG. 4 waveforms C. Constant current I1 generated by transistor T20 then discharges capacitor CT linearly and the voltage level of the emitter of transistor T18 falls until a voltage level of VS−3Vbe−VT is reached. At this level transistor T18 starts to conduct and the circuit becomes regenerative turning transistor T18 ON and transistor T19 OFF, transferring current flowing in resistor R14 to resistor R13. The collector of transistor T19 rises rapidly in voltage from VS−VT to VS. This voltage step VT is propagated via transistors T14, T16 and raises the emitter of transistor T18 from a voltage level of VS−3Vbe−VT to a voltage level VS−3Vbe. Capacitor CT transmits this voltage step VT to the emitter of transistor T19 which pumps from a voltage level VS−3Vbe to a voltage level VS−3Vbe+VT as shown in FIG. 4, waveforms C.

This completes one half cycle of the multivibrator, and the initial voltage levels assumed for transistor T18 have been transferred to transistor T19. Thus the second half cycle continues until the circuit changes state again, returning the circuit to transistor T18 being OFF, and transistor T19 being ON as initially assumed for time $t=t_o$. FIG. 4, waveform D shows the voltage across capacitor CT as a triangular waveform of amplitude 2 VT. This may be derived as the difference between the voltage waveforms at the emitters of transistors T18 and T19 (FIG. 4C).

FIG. 3 shows a Current I1 Network 16 within dashed lines. This network shares a conventional Zener diode circuit 14 with the Voltage VT Network 12. Circuit 14 can be a simple Zener diode or a Zener diode with conventional support components to generate a voltage VZ of approximately 5 volts, at node VZ, from the 10 V supply voltage Vs. This Zener circuit reduces the effect of supply voltage variations on the VCO frequency and provides a low impedance voltage source. It would not be required in the case of a power supply providing a vary stable voltage Vs or when optimum frequency stability is not necessary. In either of these two cases, reference voltage VZ could be produced by a transistor-resistor circuit.

Reference voltage VZ is applied to the base of transistor T6 via resistor R5 which has a sufficiently low resistance so that the voltage drop across resistor R5 is negligible. The collector of transistor T6 is connected to voltage supply VS and its emitter to external terminal B1. A 1% precision resistor RT is connected between external terminals B1 and B2. Diode connected transistor T8 is connected in series with resistor R7 between terminal B2 and ground. Resistor R7 has a much lower resistance than resistor RT. The current I1 through resistor RT is approximately 1.6 mA, in accordance with the following formula:

$$I1 = (VZ - 2Vbe)/RT + R7 \quad (1)$$

where Vbe is the base to emitter voltage of the transistors.

Current mirrors formed by transistor T20/resistor R15 and transistor T21/ resistor R16 are connected to terminal B2 and generate currents I1 at terminals D1 and D2 of the multivibrator. Resistors R7, R15 and R16 are of equal nominal resistance.

The Voltage VT Network 12 uses exactly the same circuit configuration having the same nominal component values as the Current I1 Network 16 to generate another current I1 through resistor R11 and produce a timing reference voltage across resistor R11 of approximately 1.6 volts.

This other current I1 is defined by applying Zener reference voltage VZ to the base of transistor T7 via resistor R6 (=R5). The emitter of transistor T7 is in series with resistor R8, diode connected transistor T9 and resistor R9 (=R7). Although the nominal values of resistors R8 and RT are the same, resistor R8 is formed on the chip with a tolerance of approximately ±10%. A current mirror formed by transistor T10 and resistor R10 (=R7) reproduces this current I1 at the collector of transistor T10. Thus the timing reference voltage VT is given by:

$$VT = (VZ - 2Vbe) \cdot R11/(R8 + R9) \quad (2)$$

As transistors T6, T8, T7 and T9 are all NPN transistors deposited on a chip, their variations of base to emitter voltage Vbe with current and temperature will be almost identical, in other words their characteristics will track each other.

In equation (1), as RT>>R7 only the temperature coefficient of external precision resistor RT is important and this is selected to be very small.

Resistors R8, R9 and R11 are all formed on the chip and so their resistance will all have the same temperature coefficient, and as circuit dissipation is low, and the chip substrate is of ceramic material, the chip is substantially isothermal and all resistors will operate at almost the same temperature. This in equation (2), the expression R11/R8+R9 is substantially independent of temperature as temperature coefficients cancel, and therefore is substantially a constant.

Having produced a timing reference voltage VT across resistor R12, this voltage VT must be buffered and reproduced across transistor T12 or T13. Then as previously explained, the voltage excursion of timing capacitor CT will be 2 VT. This reproduction is performed by means of PNP transistor T11 and resistor R12, together with NPN transistor T12 (or T13). Since PNP transistor T11 is always conducting, and NPN transistor T12 (or T13) is conducting when the excursion of timing capacitor CT is being limited, then under these conditions PNP transistor T11 increments VT by Vbe which is subsequently decremented by the Vbe of NPN transistor T12 (or T13) so that these PNP and NPN Vbe's should be equal and should track each other with temperature.

At 1 mA, the temperature coefficients are:
PNP Transistor T11—1.69 mV/°C.
NPN Transistors T12, T13—1.74 mV/°C.
and both temperature coefficients decrease with increasing current. Thus the current through the NPN transistors T12 and T13 should be greater than the current through the PNP transistor T11. Resistor R12 is selected so that these PNP and NPN Vbe's are substantially of equal magnitude and have substantially the same temperature coefficient.

From the VCO circuit of FIG. 3 and the waveforms shown in FIG. 4 it has been determined that the frequency of oscillation F0 (the center frequency) is given by:

$$F0 = I1/4CTVT \quad (3)$$

Substituting equations (1) and (2) for I1 and VT gives:

$$FO = \frac{R8 + R9}{R11(RT + R7)} \times \frac{1}{4CT} \quad (4)$$

$$= \frac{R8 + R9}{R11} \times \frac{RT}{RT + R7} \times \frac{1}{4RTCT}$$

In the term R8+R9/R11, R8>>R9, and is defined to within ±3% by manufacturing tolerances. Also this term is effectively independent of temperature, as all resistors on a chip have almost the same temperature coefficient.

In the term RT/RT+R7, the manufacturing tolerance of R7 is ±11%, but RT>R7 and RT is an external ±1% tolerance resistor having a low temperature coefficient. Thus this term is defined to within a ±2% tolerance.

The overall effect of these two terms which relate F0 to 1/RTCT is held to within ±4%. External components RT and CT are both of 1% tolerance, and are selected to have equal and opposite temperature coefficients. Statistical analysis of the circuit, including the 1% tolerances of RT and CT, gave the tolerance on the center frequency F0 as ±5%.

The operation of the Voltage Control Network 18 shown in FIG. 3 will now be described. Terminals A1 and A2 are for a differential control voltage input which varies the current I1 through resistor RT and thus varies the frequency of the oscillator. The Voltage Control Network is a differential amplifier consisting of a 1 mA constant current source IS1 supplying a total of 1 mA (I1) to first and second parallel electrical paths. The first electrical path is formed by NPN transistor T1, PNP transistor T3, and resistor R1, and R3. The second electrical path is formed by NPN transistor T2, PNP transistor T4, and resistors R2 and R4. The differential control voltage is applied between the bases of transistors T1 and T2. Since R1=R2, when the control voltage is zero, transistors T1 and T2 will each carry a 0.5 mA current. Transistor T5 connected across transistor T3 supplies base current to transistors T3 and T4 and since R3=R4, transistor T4 is a current mirror of transistor T3. Thus when the control voltage is zero transistors T4 and T3 each carry a current of 0.5 mA and zero current flows through resistor R5.

If the differential control voltage input across terminals A1/A2 changes to increase the collector current of transistor T1, to, say, 0.7 mA, then the collector current of transistor T2 will be 0.3 mA and thus 0.4 mA must flow through resistor R5 to zener reference VZ, thus raising the voltage of the base of transistor T6 and increasing current I1 through the series electrical path including T6, RT, T8 and R7. The Zener reference voltage source 14 is of sufficiently low impedance so that its current may be varied by the Voltage Control Network 18 without changing voltage VZ.

The voltage gain of the Voltage Control Network 18 differential amplifier is:

$$\text{Voltage Gain} = 2R5/(R1+R2) \quad (6)$$

With $R1=R2=2$ kΩ, and $R5=1$ KΩ, the voltage gain is 0.5. It will be noted that this voltage gain is dependent upon the quotient of resistor values which track each other with temperature, and so the voltage gain will be virtually indepedent of temperature. Manufacturing tolerances define this voltage gain to within ±3%.

Thus the Voltage Control Network 18 is a differential amplifier producing a voltage output at the base of transistor T6 which adds to or subtracts from Zener reference voltage VZ. In the case of an input control voltage VC applied across terminals A1/A2, a voltage of 0.5 VC is injected into the current I1 Network, resulting in the following:

Equation (1) becomes:

$$I1 = (VZ + 0.5VC - 2Vbe)/RT + R7 \quad (7)$$

Oscillator frequency F becomes:

$$F = \frac{VZ + 0.5VC - 2Vbe}{VZ - 2Vbe} \cdot \frac{R8 + R9}{4(RT + R7)R11CT} \quad (8)$$

$$= FO + \frac{VC}{2(VZ - 2Vbe)} \times FO$$

where F0 is the center frequency.

The gain of the VCO is:

$$\frac{\partial F}{\partial VC} = \frac{FO}{2VZ - 2Vbe} \quad (9)$$

The overall tolerance on this gain $\partial F/\partial VC$ is ±10% taking into account manufacturing tolerances, voltage supply variations and temperature variation.

The circuit shown in FIG. 3, with emitter resistors R15 and R16 being equal generates equal constant currents I1 at terminals D1 and D2 resulting in equal periods being timed by capacitor CT, the period being proportional to VT/I1. Thus a square wave voltage output waveform is generated by the VCO. However, in some VCO applications it is desirable to generate an asymmetric output waveform. This is accomplished by making resistors R15 and R16 unequal so that the constant currents become I1 and I2 and resulting periods timed by capacitor CT are unequal. Assuming that the change in the Vbe of transistors T20 and T21 may be ignored and current I2 flows through transistor T21, then I1/I2=R16/R15. Changing the circuit to produce an asymmetric output waveform does not affect the tolerance on the center frequency or gain of the VCO.

The circuit shown in FIG. 3 (excluding external timing components RT, CT) was designed to operate in a phase locked loop (PLL) for generating a cathode ray tube (CRT) horizontal timebase in a display system. The same type of PLL may be used in high quality television receivers.

Figure 5:
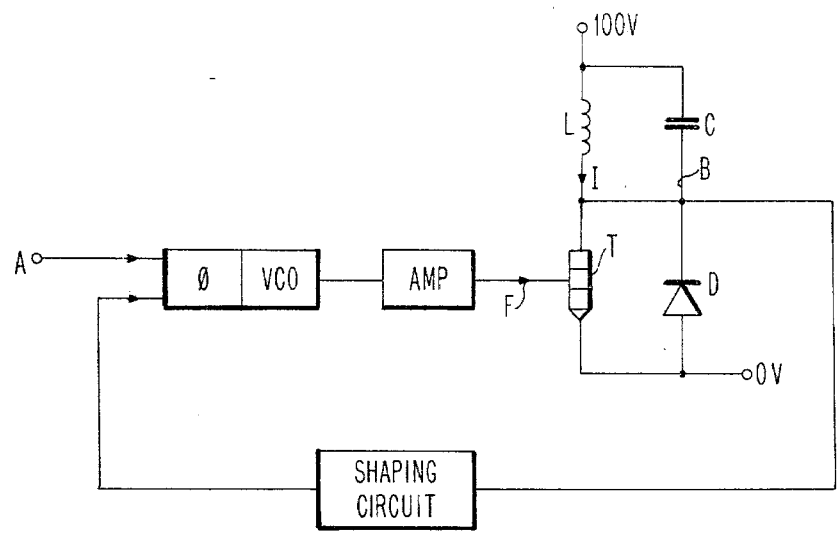
FIG. 5 illustrates the industrial use of the VCO circuit of FIG. 3 in a phase locked loop (PLL) controlling the horizontal timebase of a cathode ray tube (CRT).
Figure 6:
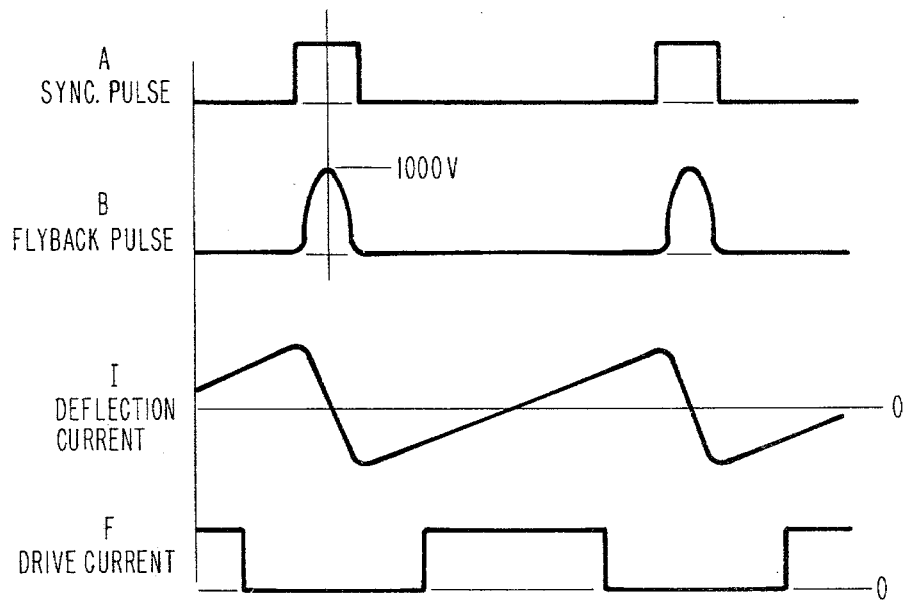
FIG. 6 shows waveforms associated with the PLL circuit of FIG. 5.

FIG. 5 illustrates this type of PLL and associated waveforms are shown in FIG. 6. The display of video data is controlled by synchronization (sync) pulses A (applied at terminal A) and the start of each scan line should be dependent upon a sync pulse A. The difficulty is that this start is determined directly by the timing of a flyback pulse B, which unless controlled will be variable. The difficulty is solved by using a PLL to position the flyback pulse B accurately at the center of the sync pulses A independently of manufacturing tolerances, power supply tolerances and temperature changes.

When transistor T is turned on by a drive current F, the current in inductor L increases linearly to generate a horizontal deflection current I for the CRT. When transistor T is turned off a flyback voltage of say 1000 volts occurs across inductor L and capacitor C. The current in inductor L now reverses as capacitor C discharges and the voltage across capacitor C falls until diode D conducts. The current in inductor L now increases linearly and will be supplied by transistor T from zero providing transistor T is turned on at an earlier time.

The flyback voltage pulse B (at node B) is shaped and reduced to logic voltage levels in the shaping circuit and fed back to one input of a phase comparator $\phi$ to whose other input sync pulses A are applied. The output of phase comparator $\phi$ is the differential control voltage VC applied across terminals A1/A2 in FIG. 3. Thus, the feedback loop is completed by a voltage controlled oscillator (VCO) as described herein and an amplifier (AMP) producing drive current F for transistor T both forming a PLL. The phase comparator $\phi$ generates a control voltage which locks the VCO frequency to the sync pulse A frequency and in such a relative phase that the flyback pulses B occur centrally with respect to the sync pulses A.

The delay between turning transistor T off and the center of the flyback pulse B is dependent upon the manufacturing tolerances on the turn-off delay of transistor T, inductor L and capacitor C, together with temperature changes and loading of power supplies derived from flyback pulse B. The just described PLL system eliminates variations in this delay. It may be noted that if the sync pulses fail, the VCO continues to run, thus avoiding damage to the power supplies dependent upon flyback pulse B.

In the display system, the VCO embodying the present invention is on the same silicon chip as the phase comparator φ, and the center frequency of the VCO is predetermined by design so that, as manufactured, it will always be within the capture range of the PLL of which it is a part. This is an advantage as it means that no skilled adjustment of the PLL is required when the display system is assembled during manufacture.

While the invention has been illustrated and described with respect to a preferred embodiment, it is to be understood that it is not limited to the precise constructions herein disclosed and the right is reserved to all changes and modifications coming within the scope of the invention as defined in the appended claims.

We claim:

1. A voltage controlled oscillator comprising:
   a voltage control network adapted to receive a control voltage input;
   an astable multivibrator having a center frequency timed by the constant current charge and discharge of a capacitor, the period timed being proportional to VT/I where VT is half the voltage swing of the capacitor and I is a constant current;
   integrated circuit means, responsive to the voltage control network, for generating both a voltage VT and constant currents I for the capacitor from a common voltage source via similar matched transistor/resistor networks so that the voltage VT and constant currents I track each other in order to minimize variations in center frequency due to temperature and supply voltage variations.

2. A voltage controlled oscillator as claimed in claim 1 wherein said voltage control network comprises:
   a differential amplifier having said control voltage as an input, and operable to vary the voltage applied to the integrated circuit means for generating constant currents I, above or below the common voltage source, to increase or decrease constant currents I;
   a variation in the amplitude of the control voltage input applied to the voltage control network causing a variation in said constant currents I1 thereby varying the frequency of said astable multivibrator.

3. A voltage controlled oscillator as claimed in claim 2 in which the gain of said differential amplifier is determined by the quotient of resistor values tracking each other with temperature in order to minimize variation of the gain of the differential amplifier with temperature.

4. A voltage controlled oscillator as claimed in claim 1 in which said matched transistor/resistor networks each comprise:
   a serial circuit connected between a voltage supply VS and ground for generating a constant current I and at least one current mirror to reproduce the constant current I.

5. A voltage controlled oscillator as claimed in claim 4 in which two current mirrors produce constant currents I for the capacitor, the capacitor being connected between the emitters of two transistors alternately switched on and off during operation of the multivibrator.

6. A voltage controlled oscillator as claimed in claim 4 in which said matched transistor/resistor network comprises a current mirror for supplying a constant current I to a resistor having one terminal connected to a voltage supply VS to generate a voltage VT across this resistor.

7. A voltage controlled oscillator as claimed in claim 5 in which said matched transistor/resistor network comprises a current mirror for supplying a constant current I to a resistor having one terminal connected to a voltage supply VS to generate a voltage VT across this resistor.

8. A voltage controlled oscillator as claimed in claim 7 in which said voltage VT is buffered into the multivibrator by means of the base emitter voltage drops of a PNP and a NPN transistor, and circuit means for providing that these voltage drops are equal and track each other with temperature variations.

9. A voltage controlled oscillator as claimed in claim 8 in which the collectors of said two transistors switched on and off during operation of the multivibrator are connected to voltage supply Vs via resistors and said NPN transistor holds the collectors of said two transistors when on at a voltage level of $VS-VT$.

10. A voltage controlled oscillator as claimed in claim 9 in which the collectors and bases of said two transistors are cross coupled via two transistor base emitter voltage drops Vbe so that the bases of said two transistors when off are held at a voltage level of $VS-VT-2Vbe$.

11. A voltage controlled oscillator as claimed in claim 6 in which said matched transistor/resistor network for generating constant currents I for the capacitor comprises:
   means for generating unequal constant currents I1 and I2 whereby an asymmetric output voltage waveform is generated by the multivibrator.

* * * * *